(12) United States Patent
Li et al.

(10) Patent No.: US 10,775,563 B2
(45) Date of Patent: Sep. 15, 2020

(54) TWDM ONU WAVELENGTH CONTROL METHOD, SYSTEM THEREOF AND SHUT-OFF DEPTH CONTROL CIRCUIT

(71) Applicants: Chengdu Superxon Communication Technology Co., Ltd., Chengdu (CN); Go!Foton Holdings, Inc., Somerset, NJ (US)

(72) Inventors: Haiyuan Li, Chengdu (CN); Feng Tian, Salem, NH (US); Zhiyong Jiang, Chengdu (CN); Chi Kong Paul Ng, Princeton, NJ (US)

(73) Assignees: Chengdu Superxon Communication Technology Co., Ltd. (CN); Go!Foton Holdings, Inc., Somerset, NJ (US)

( * ) Notice: Subject to any disclaimer, the term of this patent is extended or adjusted under 35 U.S.C. 154(b) by 0 days.

(21) Appl. No.: 16/491,729

(22) PCT Filed: Mar. 6, 2018

(86) PCT No.: PCT/US2018/021121
§ 371 (c)(1),
(2) Date: Sep. 6, 2019

(87) PCT Pub. No.: WO2018/165139
PCT Pub. Date: Sep. 13, 2018

(65) Prior Publication Data
US 2020/0257051 A1 Aug. 13, 2020

(30) Foreign Application Priority Data

Mar. 8, 2017 (CN) .......................... 2017 1 0133881

(51) Int. Cl.
G02B 6/293 (2006.01)
H01S 5/042 (2006.01)
(Continued)

(52) U.S. Cl.
CPC .......... *G02B 6/29398* (2013.01); *H01S 5/042* (2013.01); *H01S 5/0612* (2013.01);
(Continued)

(58) Field of Classification Search
CPC . G02B 6/29398; H01S 5/0612; H01S 5/0687; H01S 5/06837; H01S 5/042; H01S 5/02415; H01S 5/0617
See application file for complete search history.

(56) References Cited

U.S. PATENT DOCUMENTS 4,683,573 A * 7/1987 Albanese ............ H01S 5/06808
372/33
5,173,909 A * 12/1992 Sakano ................ H01S 5/0612
372/20
(Continued)

FOREIGN PATENT DOCUMENTS

CN 101042513 A 9/2007
CN 202748683 U 2/2013
(Continued)

OTHER PUBLICATIONS

Chinese First Office Action for Application No. 201710133881.8 dated Nov. 2, 2018, 13 pages.
(Continued)

*Primary Examiner* — Andrew Jordan
(74) *Attorney, Agent, or Firm* — Lerner, David, Littenberg, Krumholz & Mentlik, LLP (57) ABSTRACT

The present invention provides a wavelength control method, a system thereof and a shutoff depth control circuit. The method includes: enabling a current temperature of TEC (6) to be rapidly stabilized at a target temperature through a closed loop control of hardware PID (8); allowing the shut-off depth control circuit (11) to operate when a burst driver (5) that drives a light emitting assembly (3) is standby
(Continued)

or operating, providing an input to the light emitting assembly (3) through the shut-off depth control circuit (11) so that the light-emitting assembly (3) can emit the light that does not affect the normal operations of other ONU, the light emitted allows the light emitting assembly (3) to be warmed up, which enables the light emitting assembly (3) to quickly stabilize the emitted light within the bandwidth required by each channel of the system during the time period from a non-light emitting state to a light emitting state.

14 Claims, 4 Drawing Sheets

(51) Int. Cl.
*H01S 5/06* (2006.01)
*H01S 5/0687* (2006.01)
*H01S 5/0683* (2006.01)
*H01S 5/024* (2006.01)

(52) U.S. Cl.
CPC ........ *H01S 5/0687* (2013.01); *H01S 5/06837* (2013.01); *H01S 5/02415* (2013.01); *H01S 5/0617* (2013.01)

(56) References Cited

U.S. PATENT DOCUMENTS

| | | | | |
|---|---|---|---|---|
| 6,697,402 | B2 | 2/2004 | Crawford | |
| 7,251,261 | B2* | 7/2007 | Lipson | H01S 5/02446 372/34 |
| 8,606,111 | B2 | 12/2013 | Hu et al. | |
| 8,995,484 | B2* | 3/2015 | Ho | H04B 10/506 372/34 |
| 9,083,468 | B2* | 7/2015 | Zheng | H04B 10/503 |
| 9,236,945 | B2* | 1/2016 | Ho | H04B 10/40 |
| 9,281,899 | B2 | 3/2016 | Wang et al. | |
| 9,306,697 | B2 | 4/2016 | Roberts | |
| 9,368,941 | B1* | 6/2016 | Dashti | H01S 5/4087 |
| 9,722,708 | B2* | 8/2017 | Sarashina | H04J 14/0282 |
| 9,964,720 | B2* | 5/2018 | Zheng | H04J 14/02 |
| 2006/0083273 | A1* | 4/2006 | Lipson | H01S 5/0612 372/20 |
| 2012/0099611 | A1* | 4/2012 | Kim | H01S 5/141 372/20 |
| 2014/0161459 | A1* | 6/2014 | Ho | H04J 14/0246 398/79 |
| 2014/0241726 | A1* | 8/2014 | Ho | H04B 10/40 398/70 |
| 2015/0055960 | A1* | 2/2015 | Zheng | H04B 10/40 398/135 |
| 2016/0127045 | A1 | 5/2016 | Asaka et al. | |
| 2016/0248520 | A1* | 8/2016 | Sarashina | H04J 14/0282 |
| 2016/0377822 | A1* | 12/2016 | Zheng | H01S 5/02453 385/14 |
| 2018/0041007 | A1* | 2/2018 | Ashida | H01S 5/0612 |
| 2020/0161827 | A1* | 5/2020 | Tian | H04B 10/69 |

FOREIGN PATENT DOCUMENTS

| | | |
|---|---|---|
| CN | 203596499 U | 5/2014 |
| CN | 106684703 A | 5/2017 |
| JP | 2005056902 A | 3/2005 |

OTHER PUBLICATIONS

Chinese Search Report for Application No. 2017101338818 dated Oct. 27, 2018, 2 pages.
Chinese Second Office Action for Application No. 201710133881.8 dated May 5, 2019, 14 pages.
International Search Report for Application PCT/US18/21121 dated Jun. 1, 2018, pp. 1-3.

* cited by examiner

FIG. 4

TWDM ONU WAVELENGTH CONTROL METHOD, SYSTEM THEREOF AND SHUT-OFF DEPTH CONTROL CIRCUIT

CROSS-REFERENCE TO RELATED APPLICATIONS

The present application is a national phase entry under 35 U.S.C. § 371 of International Application No. PCT/US2018/021121, filed on Mar. 6, 2018, published in English, which claims the benefit of Chinese Application No. 201710133881.8, filed Mar. 8, 2017, the disclosures of which are hereby incorporated herein by reference.

TECHNICAL FIELD

The present invention relates to the field of communications engineering, and in particular to a wavelength control method of TWDM ONU applied to a narrowband system, a system thereof and a control circuit thereof.

BACKGROUND ART

TWDM ONU (time division multiplexing optical network unit) is one of the technical difficulties of NGPON (Next Generation Passive Optical Network), which is mainly due to the fact that DWDM FILTER (dense wavelength-division multiplexing filter) restricts that the bandwidth of each wavelength channel to be very narrow. For example, for each channel, the DWDM FILTER passband is actually within the range of channel center wavelength±80 pm. In this case, for a normal ONU, under the control of the system signal BEN, the module's laser continuously switches between the light emitting and non-emitting states at any time. As a result, the temperature of the laser is going to change at any time point. On the other hand, the temperature of the laser has a corresponding relationship with the wavelength thereof. Under normal circumstances, when the temperature of a laser increases by 1° C., the wavelength of the laser will increase by 0.1 nm; while when the temperature of a laser decreases by 1° C., the wavelength of the laser will decrease by 0.1 nm. Accordingly, it is very difficult to control the wavelength. In the existing technologies, a software PID is utilized to adjust the current temperature to make it reach a target temperature. However, such software PID adjustment has the issues of slow sampling, slow responding. Thus, the temperature cannot be accurately adjusted, causing the wavelength deviation to exceed the range of the DWDM passband.

SUMMARY OF THE INVENTION

The technical problem to be solved by the present invention is to provide a TWDM ONU wavelength control method that enables each wavelength to work within the passband of the DWDM FILTER.

To achieve the above object, the present invention provides the following technical solutions:

The present invention provides a wavelength control method of TWDM ONU which can be applied in a narrowband system. The method includes:

enabling a current temperature of TEC to be rapidly stabilized at a target temperature through a closed loop control of hardware PID;

allowing a shut-off depth control circuit to operate when a burst driver that drives a light emitting assembly is standby or operating, providing an input to the light emitting assembly through the shut-off depth control circuit, so that the light-emitting assembly can emit the light without affecting the normal operations of other ONU, wherein the light emitted allows the light emitting assembly to be warmed up, which enables the light emitting assembly to quickly stabilize the emitted light within the bandwidth required by each channel of a system during the time period from a non-light emitting state to a light emitting state. In addition, in one embodiment of the present invention, the shut-off depth control circuit employs NMOS. However, a person of ordinary skill in the art can easily think that other devices with good temperature drift performance can also be used in other embodiments of the present invention. For example, an NPN triode may be used to control, or a composite device with a similar function can be used to control the device.\

Preferably, the shut-off depth control circuit contains an NMOS, the input provided to the light emitting assembly by the shut-off depth control circuit is a current passing the drain and source of the NMOS and controlled by the gate of the NMOS, the gate of the NMOS is controlled by an MCU.

Preferably, a searchable table is prepared for the control voltage of the gate of the NMOS, and then a core temperature of the MCU is used as an index to compensate a change in input current of the shut-off depth control circuit caused by an environmental temperature.

Preferably, a hardware PID is sequentially connected to an H bridge controller, an H bridge, and a TEC, the difference between the voltage corresponding to a target temperature set by the MCU and the voltage corresponding to a temperature sampled from the light emitting assembly is inputted to the hardware PID, which is then converted to a control signal via the H bridge controller to control the H bridge so as to heat or cool the TEC and a new temperature is formed on the light emitting assembly, the foregoing steps are repeated to form a close looped control.

Preferably, a searchable temperature table is prepared for the target temperature set for the hardware PID by the MCU.

Preferably, when the burst driver of the light emitting assembly is on standby, the input provided via the operation of the shut-off depth control circuit allows the light power of the light emitting assembly to be maintained within a range of from −33 dBm to −30 dBm.

The present invention further provides a wavelength control system of TWDM ONU which can be applied in a narrowband system. The system includes: an MCU, a light emitting assembly, a burst driver connected to the MCU and driving the light emitting assembly, a TEC, and a TEC driver connected to the MCU, characterized in that the TEC driver performs a close looped control to a temperature of the TEC via a hardware PID, and the wavelength control system further comprises a shut-off depth control circuit connected to the MCU, the shut-off depth control circuit operates when the burst driver that drives the light emitting assembly is standby or operating, an input is provided to the light emitting assembly by the shut-off depth control circuit, so that the light-emitting assembly can emit the light without affecting the normal operations of other ONU, the light emitted allows the light emitting assembly to be warmed up, which enables the light emitting assembly to quickly stabilize the emitted light within the bandwidth required by each channel of a system during the time period from a non-light emitting state to a light emitting state.

Preferably, the shut-off depth control circuit includes an NMOS, the input provided to the light emitting assembly by the shut-off depth control circuit is a current passing the drain and source of the NMOS and controlled by the gate of the NMOS, the gate of the NMOS is controlled by an MCU DAC.

Preferably, a searchable table is prepared for the control voltage of the gate of the NMOS, and then a core temperature of the MCU is used as an index to compensate a change in input current of the shut-off depth control circuit caused by an environmental temperature.

Preferably, the hardware PID is sequentially connected to the H bridge controller, the H bridge, and the TEC, the difference between the voltage corresponding to a target temperature set by the MCU and the voltage corresponding to a temperature sampled from the light emitting assembly is inputted to the hardware PID, which is then converted to a control signal via the H bridge controller to control the H bridge so as to heat or cool the TEC and a new temperature is formed on the light emitting assembly, the foregoing steps are repeated to form a close looped control.

Preferably, a searchable temperature table is prepared for the target temperature set for the hardware PID by the MCU.

The present invention further provides a shut-off depth control circuit, the shut-off depth control circuit contains an NMOS, the input provided to a light emitting assembly by the shut-off depth control circuit is a current passing the drain and source of the NMOS and controlled by the gate of the NMOS, the gate of the NMOS is controlled by an MCU, the shut-off depth control circuit operates when the burst driver that drives the light emitting assembly is standby or operating, an input is provided to the light emitting assembly by the shut-off depth control circuit, so that the light-emitting assembly can emit the light without affecting the normal operations of other ONU, the light emitted allows the light emitting assembly to be warmed up, which enables the light emitting assembly to quickly stabilize the emitted light within the bandwidth required by each channel of a system during the time period from a non-light emitting state to a light emitting state.

Preferably, a searchable table is prepared for the control voltage of the gate of the NMOS, and then a core temperature of the MCU is used as an index to compensate a change in input current of the shut-off depth control circuit caused by an environmental temperature.

Preferably, when the burst driver of the light emitting assembly is on standby, the input provided via the operation of the shut-off depth control circuit allows the light power of the light emitting assembly to be maintained within a range of from −33 dBm to −30 dBm.

Compared with the prior art, the beneficial effects of the present invention include:

The present invention improves the system response by way of employing the hardware PID driving and controlling technology to the laser TEC circuit, and reduces the wavelength drift of the laser. Through the shut-off depth control circuit, the laser can have a warm up when a burst driver is on standby, such that the wavelength drift becomes even smaller. Through the cooperation between the hardware PID TEC Driver and the shut-off depth control circuit, the present invention is able to allow the system to use a normal DFB (Distributed Feedback Laser). Each ONU of the present invention can work on multiple DWDM wavelengths, for example, four wavelengths with each having an interval of 0.8 nm, and after each wavelength passes through the DWDM FILTER and in communications with the OLT, the wavelength of the ONU Tx can work within the DWDM FILTER passband and the wavelength will not drift out of the channel of DWDM FILTER. In this way, the present invention is able to control the laser wavelength drift range, so as to achieve the object of wavelength division multiplexing and time division multiplexing of a GPON (gigabit passive optical network).

Description of the reference numerals: MCU 1, Bosa 2, light emitting assembly 3, light receiving assembly 4, burst driver 5, TEC 6, TEC driver 7, hardware PID 8, H bridge 9, H bridge controller 10, shut-off depth control circuit 11, NMOS 12

DESCRIPTION OF EMBODIMENTS

The technical solutions of the embodiments of the present invention will be described clearly and completely hereinafter with reference to the accompanying drawings in the embodiments of the present invention. Apparently, the described embodiments are merely a part but not all embodiments of the present invention. All other embodiments obtained by a person of ordinary skill in the art based on the embodiments of the present invention without inventive efforts shall fall within the protection scope of the present invention.

Figure 1:
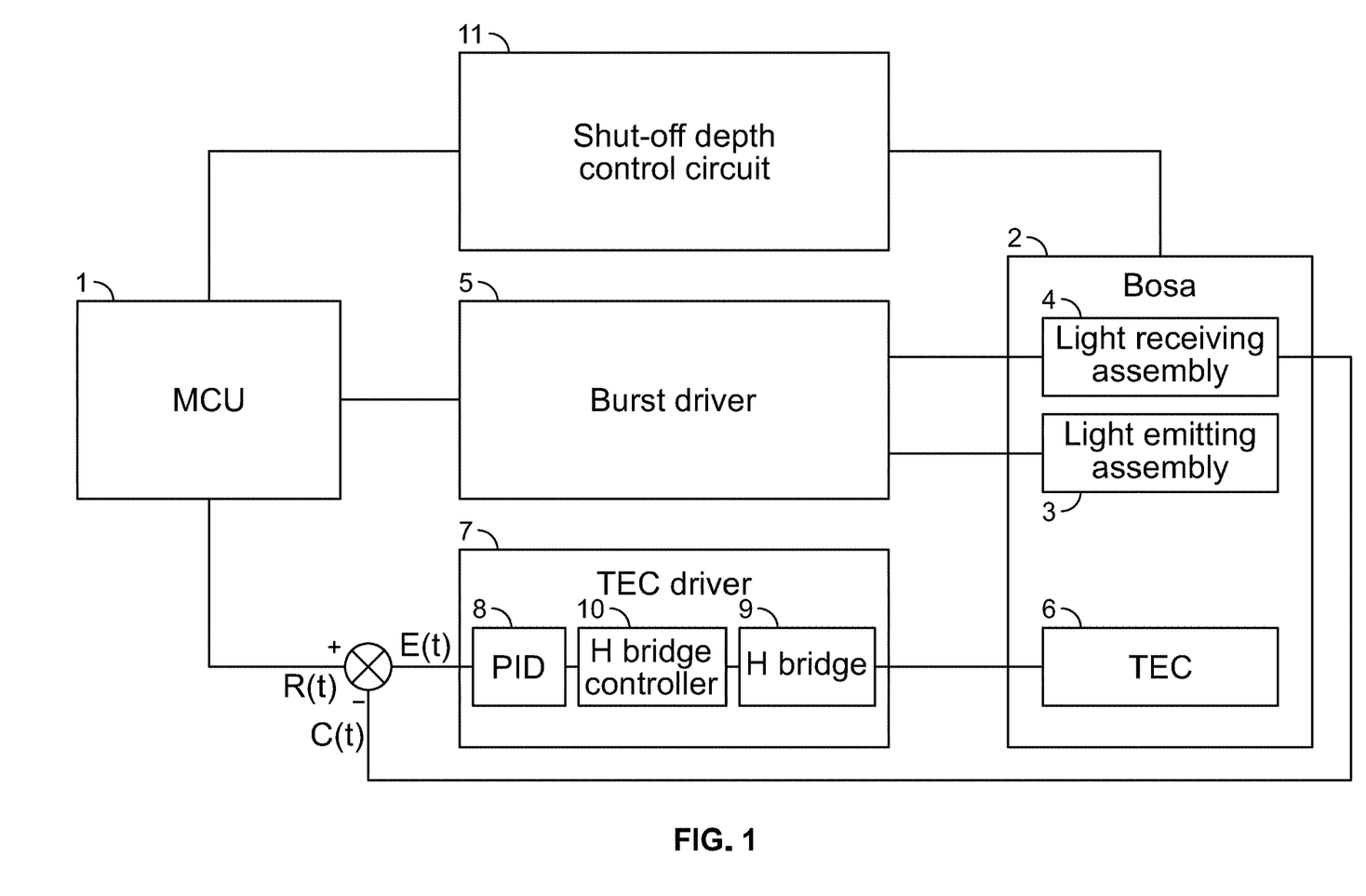
FIG. 1 is a block diagram showing the structure of the system.
Figure 2:
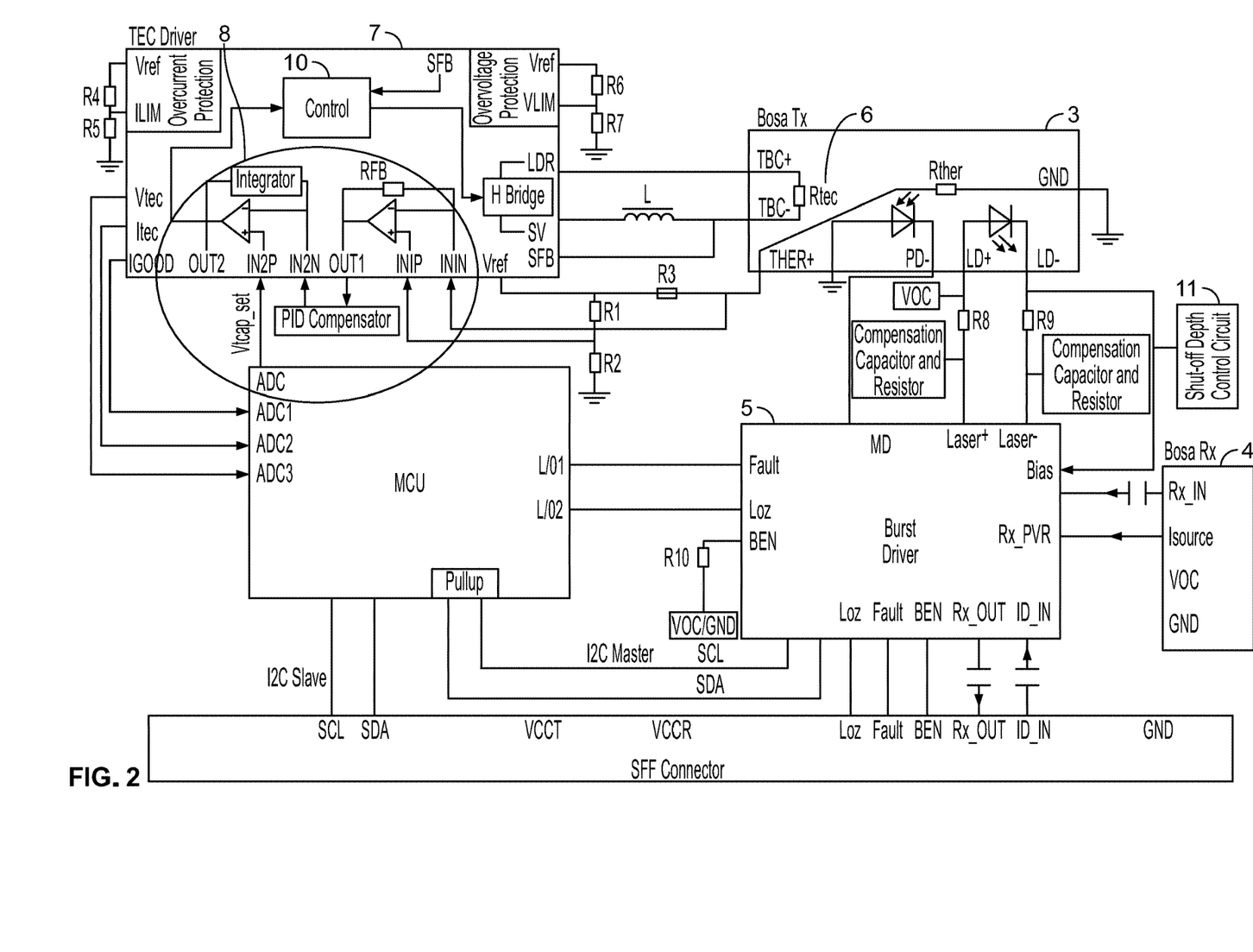
FIG. 2 is a schematic view of the circuit of one embodiment of the present invention.
Figure 3:
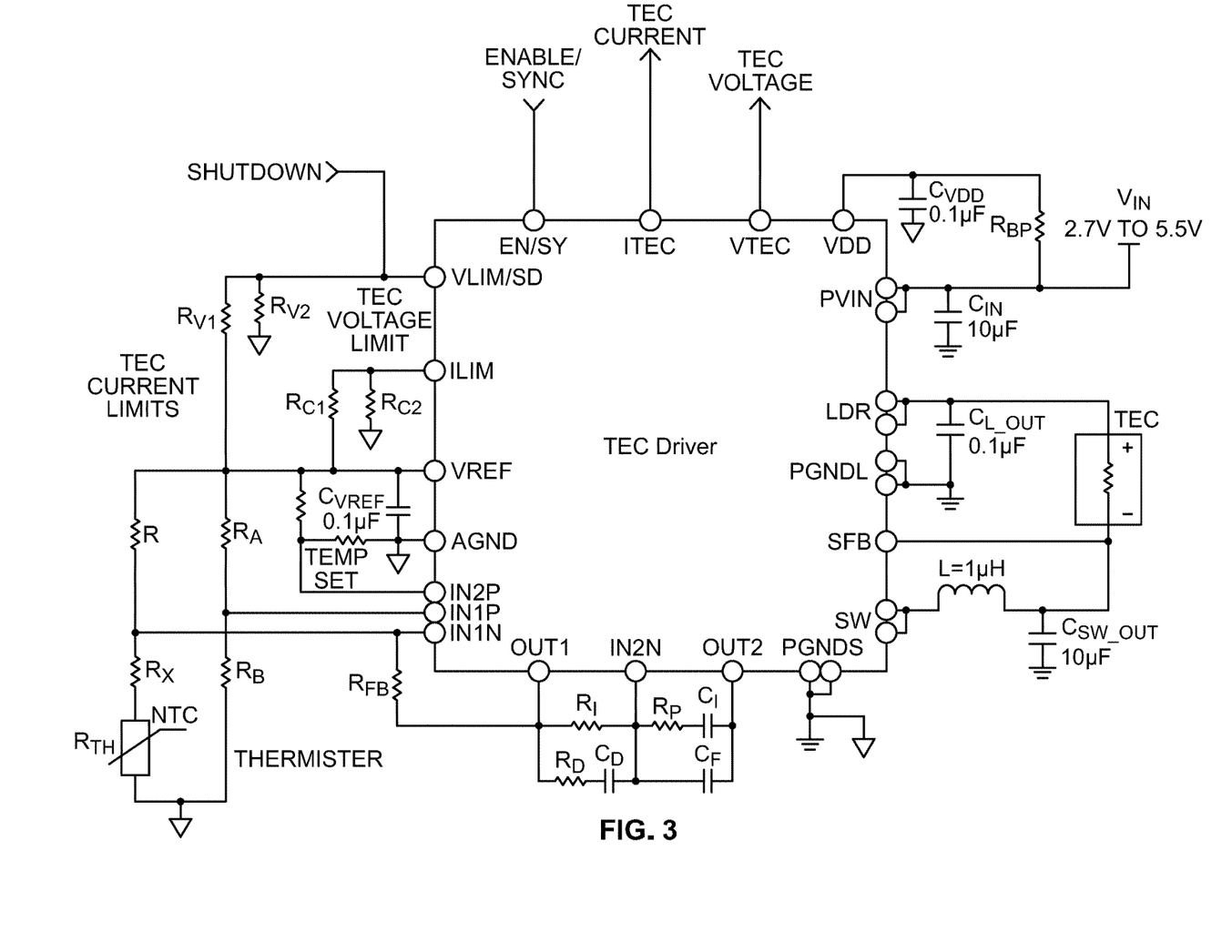
FIG. 3 is a diagram of the circuit of the TEC driver shown in FIG. 2.

FIG. 1 is a block diagram showing the structure of the system. FIG. 2 is a schematic view of the circuit of one embodiment of the present invention. FIG. 3 is a diagram of the circuit of the TEC driver shown in FIG. 2. As shown in FIGS. 1, 2 and 3, in the present invention, the wavelength control system of TWDM ONU which can be applied in a narrowband system includes an MCU 1, a light emitting and receiving assembly (Bosa) 2, a burst driver 5 connected to the MCU 1 and driving Bosa 2, the Bosa 2 contains a light emitting assembly 3, a light receiving assembly 4 and a TEC (semiconductor cooler) 6 for heating or cooling the light emitting assembly 3, in which the light emitting assembly 3 in this embodiment is a semiconductor laser. This system further includes a TEC driver 7 driving the TEC 6, and hardware PID 8 which conducts a close looped control on the temperature of TEC 6. More specifically, the TEC driver 7 includes the sequentially connected the hardware PID 8, an H bridge controller 10 controlling the current path of an H bridge 9, and the H bridge 9. The H bridge controller 10 is used to convert the PWM signals generated by MCU 1 to corresponding control signals, so as to control the direction of the voltage applied on two ends of TEC by the H bridge 9. The MCU 1 is connected to the TEC driver 7 and sets a target temperature R(t) for the TEC 6. The target temperature R(t) corresponds to the voltage in the form of PWM wave. In addition, C(t) is the voltage corresponding to the current temperature of the semiconductor laser chip obtained via sampling, E(t)=R(t)−C(t) is the voltage corresponding to the error of the current temperature. The error is adjusted by the hardware PID 8, such that a new control value is output to the H bridge controller 10 to control the direction and size of the current of the H bridge 9. In this way, TEC can heat or cool, and a new temperature C(t+1) can be generated on the Semiconductor laser. The foregoing steps are repeated to form a close looped control. In the existing technologies, the software PID adjustment has the issues of slow sampling, slow responding. Thus, the temperature cannot be accurately adjusted, causing the wavelength deviation to exceed the range of the DWDM passband. In the present invention, through the hardware PID 8, by way of adjusting the parameters of the proportional circuit, the integrating circuit and the differentiating circuit, the TEC 6 chip of the laser is able to lock the wavelength at an environment temperature within the range of from −10° C. to 60° C.

Due to the change of the environmental temperature, the wavelength corresponding to the target temperature set by the MCU 1 to the hardware PID 8 will change. Accordingly, in order to make the wavelength stable within the entire range of temperature, the target temperature set by the MCU 1 to the hardware PID 8 will be obtained from a searchable table of temperature.

It has been found in the present invention that the hardware PID 8 is not able to completely eliminate the issue that the wavelength deviation may go beyond the passband of DWDM, because the light packs emitted by the Bosa 2 can be long or short. In general, a test for each channel can be carried out by way of sending the long light packs with a duty cycle of 99%. If the wavelength is equal to the center wavelength of each channel, the requirements are considered to be met. However, for the short light packs with a duty cycle of 1%, due to its short time of light emission, the temperature is less than the temperature resulting from the transmission of long light pack with a duty cycle of 99%. As mentioned in the section of Background Art, once temperature decrease by 1° C., the wavelength of the laser will be reduced by 0.1 nm. In this case, for the short light pack with a duty cycle of 1%, the wavelength can be shifted away from the center wavelength by −80 pm. Therefore, the wavelength of the short light pack needs to be increased in order to make it above −80 pm off the center wavelength.

Figure 4:
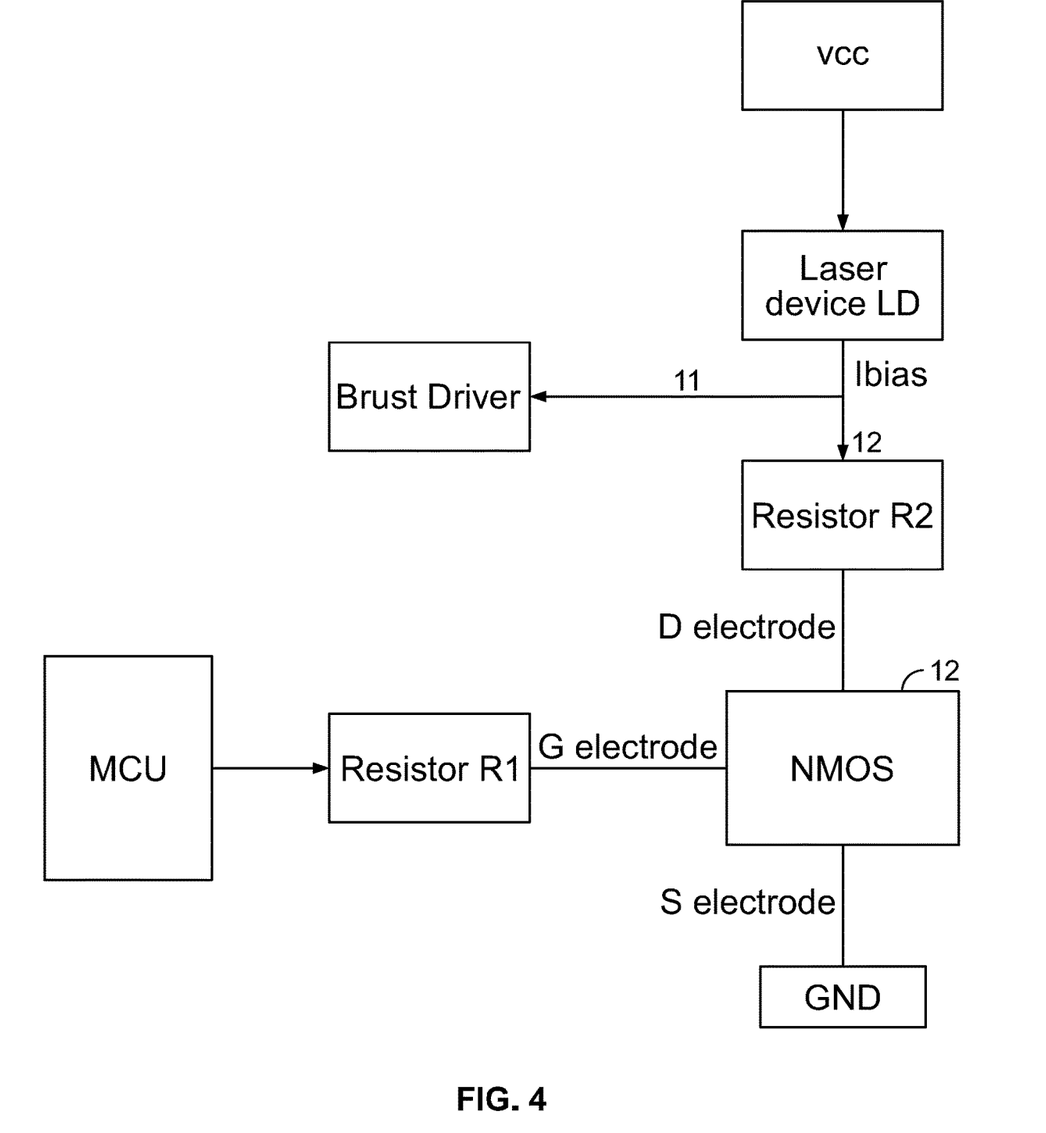
FIG. 4 is a diagram of the circuit of one embodiment of the shut-off depth control circuit according to the present invention.

FIG. 4 is a diagram of the circuit of one embodiment of the shut-off depth control circuit according to the present invention. As shown in FIG. 4, the present invention further includes a shut-off depth control circuit 11 connected to the light emitting assembly 3. The foregoing shut-off depth control circuit 11 is in fact a circuit that functions to provide an input to the light emitting assembly 3 when the burst driver 5 that drives a light emitting assembly 3 is standby or operating. This input enables the light emitting assembly 3 to emit a very weak light, which cannot be detected by downstream devices, and accordingly, it will not affect the normal operations of other ONU parts. The emitted light can warm up the light emitting assembly 3. As a result, the light emitting assembly 3 is able to quickly stabilize the emitted light within the bandwidth required by each channel of a system during the time period from a non-light emitting state to a light emitting state.

More specifically, the shut-off depth control circuit 11 contains an NMOS 12, the input provided to the light emitting assembly 3 by the shut-off depth control circuit 11 is a current I2 passing the drain and source of the NMOS 12 and controlled by the gate G of the NMOS 12, the gate G of the NMOS 12 is controlled by an MCU 1. In the present invention, the shut-off depth control circuit 11 utilizes an NMOS 12 with good temperature drift characteristics. When the burst driver 5 is operating, that is, the port BEN is ON to enable the burst driver 5 to drive the light emitting assembly 3 to emit light, the shut-off depth control circuit 11 is on. At the moment when the laser is emitting light, a bias current Ibias is injected, where the bias current Ibias is equal to a sum of the driving current I1 generated by the burst driver 5 and the input current I2 provided by the shut-off depth control circuit 11. The laser is able to emit light in a normal way driven by the burst driver 5 and the shut-off depth control circuit 11. Due to the fact that the current provided by the shut-off depth control circuit occupies a negligibly small portion of total current or bias current aforementioned to the light emitting assembly, the bias current Ibias is largely equal to the driving current I1 generated by the burst driver 5. When the burst driver 5 is on standby, that is, the port BEN of the burst driver 5 for driving the light emitting assembly 3 to emit light is turned to OFF, the burst driver 5 does not provide the driving current I1 anymore. However, in this case, the shut-off depth control circuit 11 is still in operation. MCU1 controls the gate G of the NMOS 12 so as to adjust the drain and source resistor Rds of the NMOS 12. In this way, it is able to control the drain and source current I2 of the NMOS 12, and the bias current Ibias passing the laser afterwards. As a result, the laser emits a very weak light (<−30 dBm, which will not affect the signal to noise ratio and normal signal communication). When a laser device emits light, it will also generate heat. Thus, the laser device is warmed up. This warming up will increase the temperature at which the short light pack is being transmitted, and the wavelength of the short light pack with a duty cycle of 1% as well. In this manner, the present invention can ensure that the wavelength of the short light pack is within the range of ±80 pm away from the central wavelength of each channel. At the same time, the foregoing warming up also increase the wavelength of the long light pack with a duty cycle of 99% so as to deviate from the center wavelength of each channel. However, the heat, generated by the light resulting from the shut-off depth control circuit 11 which does not affect the normal operation of other ONU, is so limited, that the wavelength of the long light pack with a duty cycle of 99% is not going to go beyond the range of ±80 pm off the central wavelength of each channel.

The threshold current Ith of the laser changes with the environmental temperature when the burst driver 5 is turned off. Thus within the full range of the temperature, the light power of the laser should be maintained within a range of from −33 dBm to −30 dBm when the burst driver 5 is turned off. A searchable table (LUT) needs to be prepared for the control voltage of the gate G of NMOS. And the core temperature of the MCU is used as an index to compensate any change in the bias current Ibias.

The present invention also provides a wavelength control method of TWDM ONU which can be applied in a narrowband system. This method includes: enabling a current temperature of TEC 6 to be rapidly stabilized towards a target temperature through a closed loop control of hardware PID 8; allowing a shut-off depth control circuit 11 to operate when a burst driver 5 that drives a light emitting assembly 3 is not operating, providing an input to the light emitting assembly 3 through the shut-off depth control circuit 11, so that the light-emitting assembly 3 can emit light that makes no effect on the normal operations of other downstream device and allows the light emitting assembly 3 to be warmed up, which enables the light emitting assembly 3 to quickly stabilize the emitted light within the bandwidth required by each channel of a system during the time period from a non-light emitting state to a light emitting state. Moreover, when the burst driver 5 that drives a light emitting assembly 3 is on standby, the input provided by the shut-off depth control circuit 11 enables the light emitting assembly 3 to maintain the light power within a range of from −33 dBm to −30 dBm. In addition, the experimental results show the closer to −30 dBm, the smaller the wavelength shift of the module during system operation. However, the shut-off depth cannot be >−30 dBm, which may cause the signal to noise ratio of the system to decrease.

In conclusion, the present invention improves the system response by way of employing the hardware PID driving and controlling technology to the laser TEC circuit, and reduces the wavelength drift of the laser. Through the shut-off depth control circuit, the laser can have a warm up when a burst driver is on standby, such that the wavelength drift becomes even smaller. Through the cooperation between the hardware PID TEC Driver and the shut-off depth control circuit, the present invention is able to allow the system to use a normal DFB (Distributed Feedback Laser). Each ONU of the present invention can work on multiple DWDM wavelengths, for example, four wavelengths with each having an interval of 0.8 nm, and after light of each wavelength passes through the DWDM FILTER and arrives at the OLT (end of light path), the wavelength of the ONU Tx can work within the DWDM FILTER passband and the wavelength will not drift out of the channel of DWDM FILTER. In this way, the present invention is able to control the laser wavelength drift range, so as to achieve the object of wavelength division multiplexing and time division multiplexing of a GPON (gigabit passive optical network).

What is claimed is:

1. A TWDM ONU wavelength control method, characterized in that the wavelength control method comprising:
enabling a current temperature of TEC to be rapidly stabilized at a target temperature through a closed loop control of hardware PID;
allowing a shut-off depth control circuit to operate when a burst driver that drives a light emitting assembly is standby or operating, providing an input to the light emitting assembly through the shut-off depth control circuit, so that the light-emitting assembly can emit the light that does not affect the normal operations of other ONU, wherein the light emitted allows the light emitting assembly to be warmed up, which enables the light emitting assembly to quickly stabilize the emitted light within the bandwidth required by each channel of a system during the time period from a non-light emitting state to a light emitting state.

2. The TWDM ONU wavelength control method according to claim 1, characterized in that the shut-off depth control circuit comprises an NMOS, the input provided to the light emitting assembly by the shut-off depth control circuit is a current passing the drain and source of the NMOS and controlled by the gate of the NMOS, the gate of the NMOS is controlled by an MCU.

3. The TWDM ONU wavelength control method according to claim 2, characterized in that a searchable table is prepared for the control voltage of the gate of the NMOS, and then a core temperature of the MCU is used as an index to compensate a change in input current of the shut-off depth control circuit caused by an environmental temperature.

4. The TWDM ONU wavelength control method according to claim 1, characterized in that a hardware PID is sequentially connected to an H bridge controller, an H bridge, and a TEC, the difference between the voltage corresponding to a target temperature set by the MCU and the voltage corresponding to a temperature sampled from the light emitting assembly is inputted to the hardware PID, which is then converted to a control signal via the H bridge controller to control the H bridge so as to heat or cool the TEC and a new temperature is formed on the light emitting assembly, the foregoing steps are repeated to form a close looped control.

5. The TWDM ONU wavelength control method according to claim 4, characterized in that a searchable temperature table is prepared for the target temperature set for the hardware PID by the MCU.

6. The TWDM ONU wavelength control method according to claim 5, characterized in that when the burst driver of the light emitting assembly is on standby, the input provided via the operation of the shut-off depth control circuit allows the light power of the light emitting assembly to be maintained within a range of from −33 dBm to −30 dBm.

7. A TWDM ONU wavelength control system, comprising an MCU, a light emitting assembly, a burst driver connected to the MCU and driving the light emitting assembly, a TEC, and a TEC driver connected to the MCU, characterized in that the TEC driver performs a close looped control to a temperature of the TEC via a hardware PID, and the wavelength control system further comprises a shut-off depth control circuit connected to the MCU, the shut-off depth control circuit operates when the burst driver that drives the light emitting assembly is standby or operating, an input is provided to the light emitting assembly by the shut-off depth control circuit, so that the light-emitting assembly can emit the light that does not affect the normal operations of other ONU, the light emitted allows the light emitting assembly to be warmed up, which enables the light emitting assembly to quickly stabilize the emitted light within the bandwidth required by each channel of a system during the time period from a non-light emitting state to a light emitting state.

8. The TWDM ONU wavelength control system according to claim 7, characterized in that the shut-off depth control circuit comprises an NMOS, the input provided to the light emitting assembly by the shut-off depth control circuit is a current passing the drain and source of the NMOS and controlled by the gate of the NMOS, the gate of the NMOS is controlled by an MCU.

9. The TWDM ONU wavelength control system according to claim 8, characterized in that a searchable table is prepared for the control voltage of the gate of the NMOS, and then a core temperature of the MCU is used as an index to compensate a change in input current of the shut-off depth control circuit caused by an environmental temperature.

10. The TWDM ONU wavelength control system according to claim 7, characterized in that the TEC driver comprises an H bridge and an H bridge controller, the hardware PID is sequentially connected to the H bridge controller, the H bridge, and the TEC, the difference between the voltage corresponding to a target temperature set by the MCU and the voltage corresponding to a temperature sampled from the light emitting assembly is inputted to the hardware PID, which is then converted to a control signal via the H bridge controller to control the H bridge so as to heat or cool the TEC and a new temperature is formed on the light emitting assembly, the foregoing steps are repeated to form a close looped control.

11. The TWDM ONU wavelength control system according to claim 7, characterized in that a searchable temperature table is prepared for the target temperature set for the hardware PID by the MCU.

12. A shut-off depth control circuit, characterized in that the shut-off depth control circuit comprises an NMOS, the input provided to a light emitting assembly by the shut-off depth control circuit is a current passing the drain and source of the NMOS and controlled by the gate of the NMOS, the gate of the NMOS is controlled by an MCU, the shut-off depth control circuit operates when the burst driver that drives the light emitting assembly is standby or operating, an input is provided to the light emitting assembly by the shut-off depth control circuit, so that the light-emitting assembly can emit the light that does not affect the normal operations of other ONU, the light emitted allows the light emitting assembly to be warmed up, which enables the light emitting assembly to quickly stabilize the emitted light within the bandwidth required by each channel of a system during the time period from a non-light emitting state to a light emitting state.

13. The shut-off depth control circuit according to claim 12, characterized in that a searchable table is prepared for the control voltage of the gate of the NMOS, and then a core temperature of the MCU is used as an index to compensate a change in input current of the shut-off depth control circuit caused by an environmental temperature.

14. The shut-off depth control circuit according to claim 12, characterized in that when the burst driver of the light emitting assembly is on standby, the input provided via the operation of the shut-off depth control circuit allows the light power of the light emitting assembly to be maintained within a range of from −33 dBm to −30 dBm.

* * * * *